(12) United States Patent
Marella et al.

(10) Patent No.: US 7,514,681 B1
(45) Date of Patent: Apr. 7, 2009

(54) ELECTRICAL PROCESS MONITORING USING MIRROR-MODE ELECTRON MICROSCOPY

(75) Inventors: Paul F. Marella, San Jose, CA (US); Mark A. McCord, Los Gatos, CA (US); Marian Mankos, Palo Alto, CA (US); David L. Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 269 days.

(21) Appl. No.: 11/451,698

(22) Filed: Jun. 13, 2006

(51) Int. Cl.
 *H01L 21/02* (2006.01)
 *H01J 37/145* (2006.01)
 *G21K 7/00* (2006.01)

(52) U.S. Cl. .................. 250/310; 250/306; 250/307; 250/370.08; 250/492.1; 324/501; 324/750; 324/751; 324/765

(58) Field of Classification Search .......... 250/306, 250/307, 310, 311, 370.08, 372, 492.1, 492.2, 250/492.21, 492.22, 492.23, 492.24, 492, 250/3, 494.1, 504 R; 324/500, 501, 750, 324/751, 765
See application file for complete search history.

(56) References Cited

U.S. PATENT DOCUMENTS

| | | | | |
|---|---|---|---|---|
| 5,633,595 | A * | 5/1997 | Ueda et al. .................. | 324/751 |
| 6,038,018 | A * | 3/2000 | Yamazaki et al. ......... | 356/237.1 |
| 6,087,189 | A | 7/2000 | Huang | |
| 6,465,781 | B1 * | 10/2002 | Nishimura et al. .......... | 250/306 |
| 6,563,114 | B1 * | 5/2003 | Nagahama et al. .......... | 250/310 |
| 6,610,980 | B2 * | 8/2003 | Veneklasen et al. ......... | 250/310 |
| 6,878,937 | B1 | 4/2005 | Mankos | |
| 6,930,309 | B1 * | 8/2005 | Mankos et al. .............. | 250/310 |
| 6,943,569 | B1 | 9/2005 | Pressley et al. | |
| 6,980,011 | B1 | 12/2005 | Chowdhury et al. | |
| 2002/0070340 | A1 * | 6/2002 | Veneklasen et al. ......... | 250/310 |
| 2002/0109090 | A1 * | 8/2002 | Nakasuji et al. ............. | 250/311 |
| 2002/0130262 | A1 * | 9/2002 | Nakasuji et al. ............. | 250/311 |
| 2003/0155927 | A1 * | 8/2003 | Pinto et al. .................. | 324/501 |
| 2004/0183013 | A1 * | 9/2004 | Nakasuji et al. ............. | 250/310 |
| 2005/0173633 | A1 * | 8/2005 | Tanaka et al. ............... | 250/311 |
| 2007/0018101 | A1 * | 1/2007 | Nakasuji et al. ............. | 250/310 |
| 2007/0045536 | A1 * | 3/2007 | Nakasuji et al. ............. | 250/310 |

OTHER PUBLICATIONS

S.D. Golladay, et al., "Electron-Beam Technology For Open/Short Testing Of Multi-Chip Substrates", IBM J. Res. Develop. vol. 34 No. 2/3, Mar./ May 1990, pp. 250-259, US.

* cited by examiner

*Primary Examiner*—Bernard E Souw
(74) *Attorney, Agent, or Firm*—Okamoto & Benedicto LLP

(57) ABSTRACT

One embodiment relates to a method of inspecting a substrate using electrons. Mirror-mode electron-beam imaging is performed on a region of the substrate at multiple voltage differences between an electron source and a substrate, and image data is stored corresponding to the multiple voltage differences. A calculation is made of a measure of variation of an imaged aspect of a feature in the region with respect to the voltage difference between the electron source and the substrate. Other embodiments and features are also disclosed.

32 Claims, 7 Drawing Sheets

Method of determining process-related parameter 200

Method of determining process-related parameter    200

Example transistor     500

Example transistor with defective gate oxide     520

Method of building map of process variation across wafer    600

ELECTRICAL PROCESS MONITORING USING MIRROR-MODE ELECTRON MICROSCOPY

BACKGROUND OF THE INVENTION

1. Field of the Invention

The present invention relates to semiconductor manufacturing. More particularly, the present invention relates to electrical process monitoring for semiconductor manufacturing.

2. Description of the Background Art

Automated inspection and review systems are important in process control and yield management for the semiconductor and related microelectronics industries. Such systems include optical and electron beam (e-beam) based systems.

In the manufacture of semiconductor devices, detection of physical defects and electrical failure earlier in the fabrication process is becoming increasingly important to shorten product development cycles and increase product yield and productivity. Advanced wafer inspection systems based on scanning electron microscopy technology have been used to detect defects and electrical failure as voltage contrast defects. However, as device design rules further shrink, and new processes are being widely implemented, it becomes more challenging to detect defects in device structures with smaller design rules and higher aspect ratios.

Electrical process monitoring refers to the detection of electrical characteristics and defects during manufacture of integrated circuits. Conventional techniques of electrical process monitoring include electrical probing and voltage contrast imaging.

Electrical probing disadvantageously requires special test structures to be included in the semiconductor dies being monitored. In addition, electrical probing is generally very slow and typically requires that the testing be done late in the overall process flow or at end-of-line test.

In voltage contrast electron beam imaging, the voltage of a structure being imaged determines the brightness of that structure in the image. This may be achieved by selective energy filtering to control the detection of secondary electrons in order to enhance the voltage contrast. Electron beam methods using voltage contrast may be much faster than electrical probing and may be performed in-line during the fabrication process. However, such voltage contrast techniques lack voltage-contrast sensitivity and resistance discrimination. For example, current voltage contrast methods have a voltage resolution of typically 5 to 10 volts, and a resistance resolution of about 10 megaohms. Such resolution is inadequate, except for rather crude process measurements.

What is needed is a technique for electrical process monitoring which may be performed rapidly and in-line during the fabrication process. In addition, what is needed is for the technique to have improved voltage-contrast sensitivity and hence improved resistance discrimination.

SUMMARY

One embodiment relates to a method of inspecting a substrate using electrons. Mirror-mode electron-beam imaging is performed on a region of the substrate at multiple voltage differences between an electron source and a substrate, and image data is stored corresponding to the multiple voltage differences. A calculation is made of a measure of variation of an imaged aspect of a feature in the region with respect to the voltage difference between the electron source and the substrate.

Another embodiment relates to an apparatus including an electron beam instrument, a data processing system, and processor-executable code. The electron beam instrument is configured for mirror-mode electron-beam imaging of a region of the substrate at multiple voltage differences between an electron source and a substrate, and the data processing system is configured to store image data corresponding to the multiple voltage differences. The processor-executable code is configured to calculating a measure of variation of an imaged aspect of a feature in the region with respect to the voltage difference between the electron source and the substrate.

Another embodiment relates to an apparatus for inspecting a substrate using a projection electron beam system. The apparatus includes an illumination subsystem, an objective subsystem, a projection subsystem, a beam separator, and a control system. The beam separator is configured to receive the incident beam from the illumination subsystem, bend the incident electron beam towards the objective subsystem, receive the scattered beam from the objective subsystem, and bend the scattered beam towards the projection subsystem. The control system is configured to controllably vary a potential difference between a source of the incident electron beam and the substrate so that the image data is detected at multiple potential differences between the source and the substrate.

Another embodiment relates to a method of inspecting a substrate using electrons which uses both mirror-mode electron-beam imaging and scattered electron imaging. Mirror-mode electron-beam imaging is performed on a region of the substrate at multiple voltage differences between an electron source and a substrate, and the mirror-mode image data is stored corresponding to the multiple voltage differences. Scattered electron imaging of the region is also performed, and the scattered electron image data is also stored. Gray levels of a feature in the region in the mirror-mode image data is compared to scattered electron image data of the feature.

Other embodiments and features are also described herein.

DETAILED DESCRIPTION

The technique disclosed herein and described below is advantageously capable of rapidly determining a process-related electrical parameter without the need for end-of-line probing or special test structures. Furthermore, this novel technique has been shown to have voltage contrast sensitivity in the tens of milli-volt range, which is orders of magnitude better than the sensitivity for typical scanning electron microscopes (SEMs). Typical SEMs have voltage contrast sensitivity of a few volts. Hence, the presently disclosed technique allows much more accurate measurements for electrical process monitoring, parametric measurement, and process control.

An alternative technique for determining a process-related parameter would be to incorporate an energy filter into a traditional SEM apparatus. However, energy filters with sub-volt resolution are complicated to design and manufacture, difficult to calibrate, and may have poor collection efficiency. The poor collection efficiency may disadvantageously increase the required image collection time.

Figure 1:
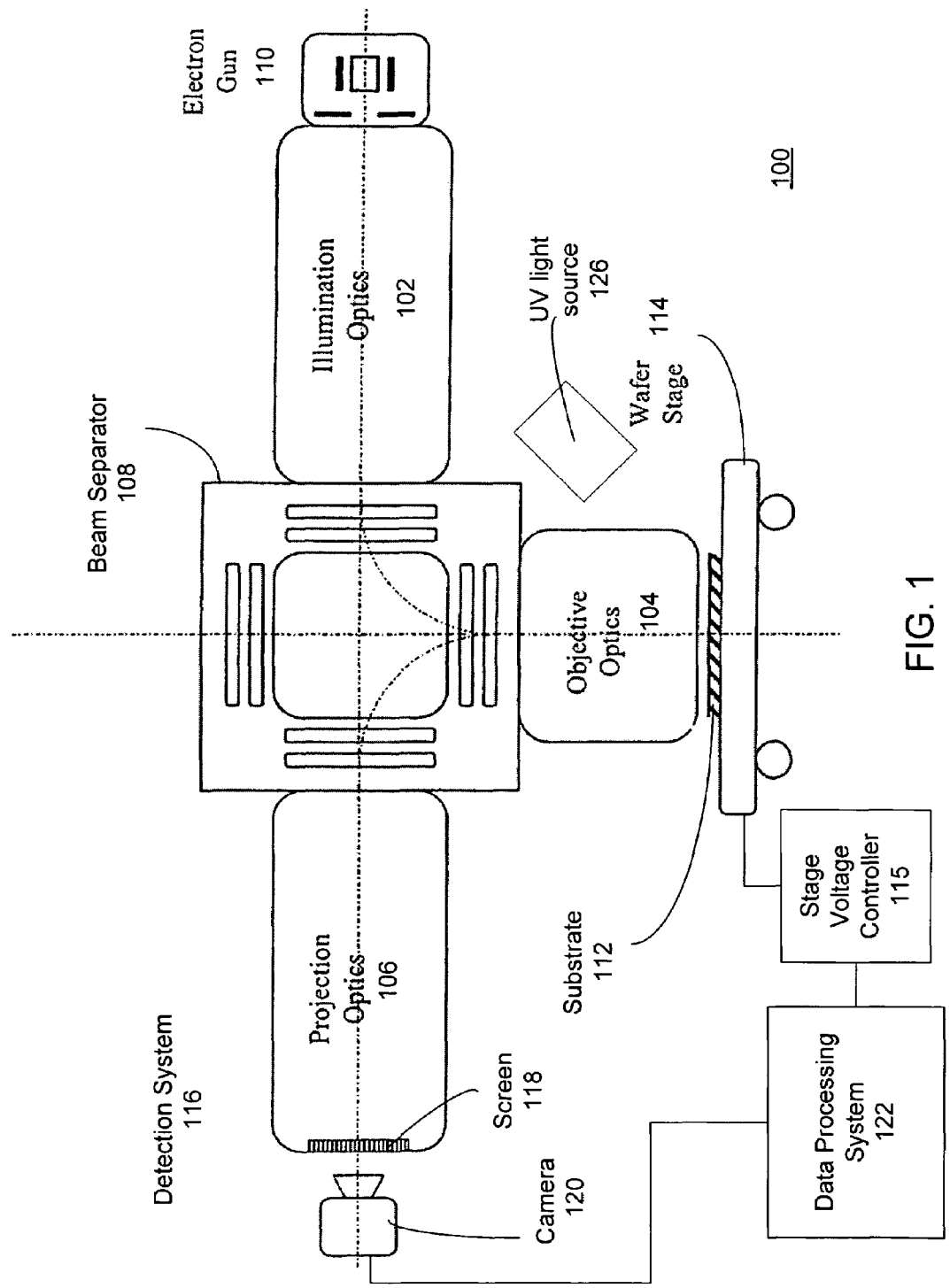
FIG. 1 is a schematic diagram depicting an apparatus for inspecting a substrate using mirror-mode electron microscopy in accordance with an embodiment of the invention.

FIG. 1 is a schematic diagram depicting an apparatus 100 for inspecting a substrate using electrons in accordance with an embodiment of the invention. While the apparatus 100 depicted in FIG. 1 comprises a projection electron beam system in a mirror mode, an alternative embodiment may be implemented which comprises a scanning electron beam system in a mirror mode.

The apparatus 100 shown in FIG. 1 includes an illumination subsystem 102, an objective subsystem 104, a projection subsystem 106, and a beam separator 108. The beam separator 108 is coupled to and interconnects the illumination subsystem 102, the objective subsystem 104, and the projection subsystem 106.

The illumination subsystem (illumination optics) 102 is configured to receive and collimate electrons from an electron source. In a preferred embodiment, the source comprises an electron gun 110. In a preferred embodiment, the illumination subsystem 102 comprises an arrangement of magnetic and/or electrostatic lenses configured to focus the electrons from the source so as to generate an incident electron beam. The specific details of the arrangement of lenses depend on specific parameters of the apparatus and may be determined by one of skill in the pertinent art.

The beam separator 108 is configured to receive the incident beam from the illumination subsystem 102 and to bend or deflect the incident beam by 90 degrees into the objective subsystem 104. In a preferred embodiment, the beam separator 108 comprises a magnetic prism array.

The objective subsystem (objective optics) 104 is configured to receive the incident beam from the beam separator 108 and to decelerate and focus the incident beam onto or just above the substrate 112 in accordance with mirror-mode operation. In this mirror-mode operation, the incident beam being projected onto or just above the surface of the substrate 112 causes reflection and/or emission of a reflected (scattered) beam of electrons from the substrate 112. The reflected beam comprises a two-dimensional image of the illuminated area of the substrate 112.

The objective optics 104 is further configured to re-accelerate the reflected beam and to refocus the two-dimensional image of the substrate area. In a preferred embodiment, the objective optics 104 comprises an arrangement of magnetic and/or electrostatic lenses configured to focus and decelerate the incident beam to the substrate 112 and to retrieve and re-accelerate the reflected beam from the substrate 112.

In one implementation, to accomplish the deceleration and re-acceleration, the stage holding the substrate 112 may be maintained at a negative high voltage potential close to that of the incident beam source in the illumination subsystem 102 while the objective optics 104 and other components are at ground potential. In an alternative arrangement, the stage holding the substrate 112 and the electron source in the illumination subsystem 102 may be at ground potential, and the objective optics 104 and other components at a high voltage. Further specific details of the arrangement of lenses depend on specific parameters of the apparatus and may be determined by one of skill in the pertinent art.

The beam separator 108 is configured to receive the reflected beam from the objective optics 104 and to bend the reflected beam towards the projection subsystem 106. A preferred embodiment of the beam separator 108 is described further in U.S. Pat. No. 6,878,937, issued on Apr. 12, 2005, to Marian Mankos and entitled "Prism Array for Electron Beam Inspection and Defect Review." The disclosure of U.S. Pat. No. 6,878,937 is hereby incorporated by reference.

The projection subsystem (optics) 106 is configured to receive the reflected beam from the beam separator 108 and to magnify and project the reflected beam onto a detector 116. In this way, a magnified two-dimensional image of the illuminated substrate area is obtained. In one embodiment, the detector 116 may comprise a phosphorescent screen 118 and a camera 120 as depicted. In another embodiment, the detector 116 may include a charge-coupled device (CCD) array.

In accordance with an embodiment of the invention, the apparatus 100 includes a data processing system 122. The data processing system 122 is configured to receive image data from the detection system 116 and to process that image data according to processor-executable instructions or code. The processor-executable instructions or code may be configured to implement the method 200 described below in relation to FIG. 2 and FIG. 6, for example.

In further accordance with an embodiment of the invention, the apparatus 100 may include a stage voltage controller 115. The stage voltage controller 115 is configured to control a voltage level of the stage 114 which holds the substrate 112 being imaged. The stage voltage controller 115 may also be communicatively interconnected with the data processing system 122.

In accordance with an embodiment of the apparatus, a dual-beam implementation is used for superior voltage control. For example, the electron gun 110 may comprise a dual-beam gun. The dual-beam gun may provide a lower-energy electron beam for mirror-mode imaging and a higher-energy electron beam for controlled surface charging. Due to its higher velocity, the higher-energy electron beam is bent or deflected through a smaller angle in the separator 108 than the lower-energy electron beam. As such, in one implementation, the higher-energy electron beam may originate from a source located slightly above and behind the source of the lower-energy electron beam. The configuration may be designed such that the two beams are decelerated and focused by the objective electron optics 104 to form coincident and parallel flood beams that illuminate the substrate surface. An aperture may be positioned appropriately within the projection electron optics so as to select the reflected lower-energy electrons (rather than secondary or back-scattered electrons emitted from the surface due to the impingement of the higher-energy electrons) for imaging.

In accordance with another embodiment of the apparatus, an ultraviolet (UV) light beam is used to illuminate the region. By illuminating the region with UV light, surface charging may be advantageously controlled. The UV light beam may be implemented using a UV light source 126 which is positioned separate and apart from the electron beam gun. The UV light beam may illuminate a region which encompasses the region being imaged by the electron beam, and the UV light beam may illuminate the substrate surface at an angle (which is not normal to the surface).

Figure 2:
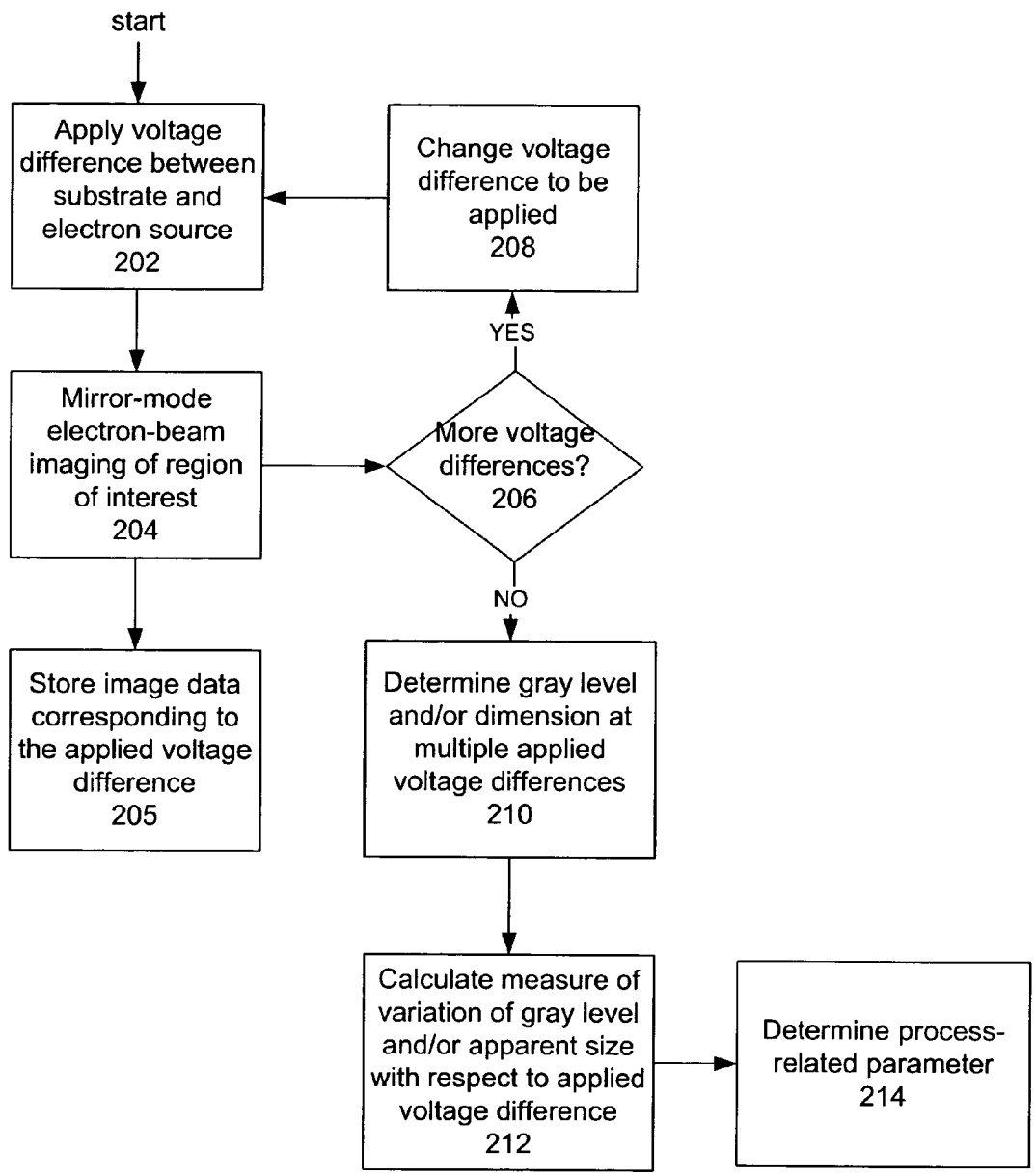
FIG. 2 is a flow chart depicting a method of determining a process-related parameter using mirror-mode electron microscopy in accordance with an embodiment of the invention.

FIG. 2 is a flow chart depicting a method 200 of determining a process-related parameter using mirror-mode electron microscopy in accordance with an embodiment of the invention. The mirror-mode electron imaging may be performed, for example, using an electron beam apparatus 100 such as discussed above in relation to FIG. 1.

As shown in FIG. 2, a voltage difference may be applied 202 between the stage holding the substrate and the electron source. As discussed above, the applied voltage difference is relatively small such that the substrate is at a potential close to the potential of the electron source. This is so that the electron imaging may be performed in a mirror-mode, where the incident electrons are typically reflected from the surface of the substrate.

Mirror-mode electron-beam imaging is then performed 204 on a region of interest of the substrate surface. One or more frames of image data corresponding to the applied voltage difference is stored 205. Contrast within the image data obtained via mirror-mode electron-beam imaging is created by variation in an outer potential (work function) at the substrate surface. The image data is stored 205 such that it is determinable at which applied voltage difference it was obtained.

A determination 206 is made as to whether there are more voltage differences at which to obtain mirror-mode imaging data. Preferably, mirror-mode imaging data is obtained by varying the stage voltage while the voltage at the electron source is held constant. For example, the range of applied voltage differences may be over a few volts in increments of a fraction of a volt. In one specific example, the range may go from −1.37 volts to +1.65 volts, as shown by the series of images in FIG. 3. The field of view of each electron image is about 45 microns by 24 microns.

If there are more voltage differences at which to obtain mirror-mode imaging data, then the voltage difference may be changed or incremented 208 (for example, by changing the stage voltage while keeping the source voltage constant), and the process 200 may loop back to apply 202 the new voltage difference and perform 204 the mirror-mode imaging of the region of interest with the new applied voltage difference.

Once there are no more voltages at which to obtain mirror-mode imaging data, then the process 200 may move on to determine 210 a gray level and/or apparent dimension or size of a feature or features at the multiple applied stage voltages. A measure of variation in the gray level and/or apparent size of the feature or features with respect to the applied stage voltage may then be calculated 212. As a simple example, the imaged aspect of the feature (either the gray level or apparent dimension) may be graphed as a function of the applied stage voltage, and a linear function may be fitted to the graphed data. The slope (rate of change) of the linear function is a simple example of a calculated measure of variation of that imaged aspect with respect to the applied voltage difference. A process-related parameter may then be determined 214 based on the calculated measure of variation.

In addition to, or alternatively to, calculating 212 a measure of the variation in the gray level and/or apparent size of a feature with respect to the applied voltage difference, other analysis and comparisons may be made. For example, the gray levels and/or apparent sizes of a feature in the mirror-mode electron-beam images may be compared with the gray levels and/or apparent sizes of the feature in secondary electron images and/or backscattered electron images. The results of such comparisons may be utilized in determining process-related parameters.

Figure 3:
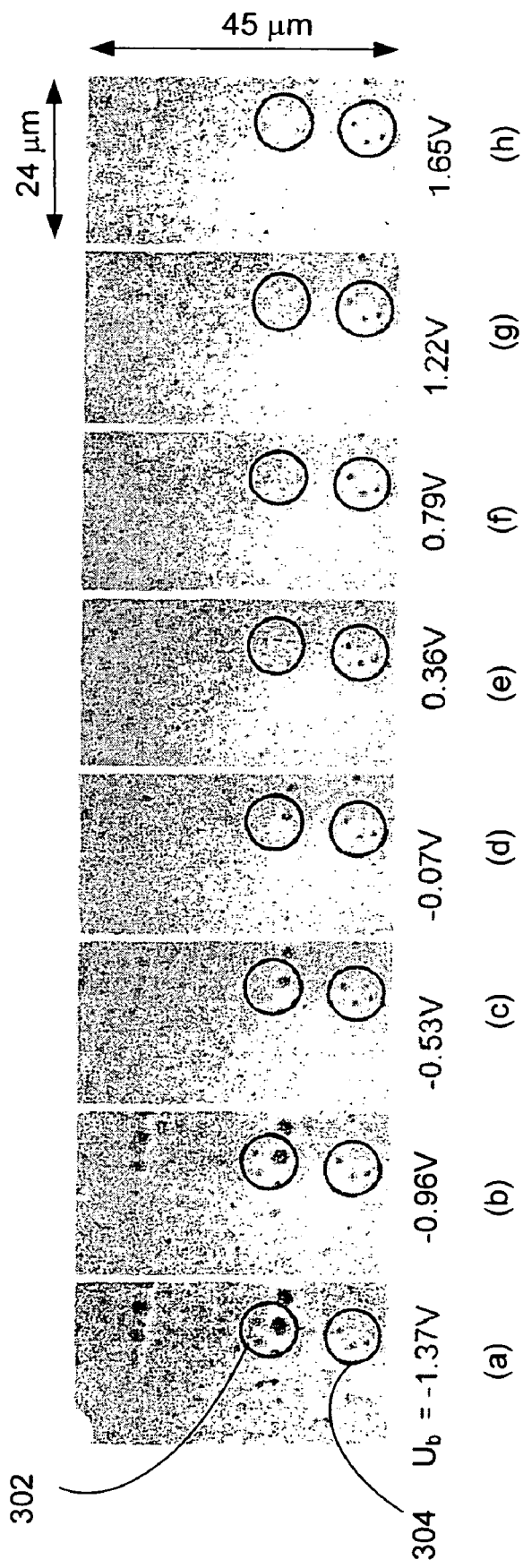
FIG. 3 shows a series of eight mirror-mode electron beam images of a region of interest at various stage voltages in accordance with an embodiment of the invention.

FIG. 3 shows a series of eight (a, b, c, d, e, f, g, and h) mirror-mode electron beam images of a region of interest at various stage voltages in accordance with an embodiment of the invention. These images were experimentally obtained from a semiconductor substrate using a mirror-mode electron beam system. Within each image, two specific sub-regions 302 and 304 with features therein are circled.

The first sub-region 302 of the images includes contact holes whose intensities and apparent sizes vary considerably over the range of applied voltage differences. The intensities of the contact holes in the first sub-region 302 are darkest (higher contrast against background intensity) in the leftmost image (a) corresponding to a voltage difference ($U_b$) of negative 1.37 volts, and become visibly less dark (lower contrast against background intensity) as the series of images progresses as the voltage difference becomes more positive. In addition, the apparent sizes of the contact holes in the first sub-region 302 appear to get smaller as the series of images progresses to more positive voltage differences. In other words, the intensities and apparent sizes of the contact holes in the first sub-region 302 show substantial variation with respect to the applied voltage difference. This variation may be calculated from the image data, and a determination may be made based on that calculation as to the resistance of the contact holes in the first sub-region 302. In this case, a high variation with respect to applied voltage difference indicates a low contact resistance and hence substantially cleanly etched contact holes.

In contrast, the second sub-region 304 of the images includes contact holes whose intensities and apparent sizes stay relatively constant over the range of applied voltage differences. The intensities and apparent sizes of the contact holes in the second sub-region 304 appear to stay substantially constant across the range of applied voltage differences from negative 1.37 volts to positive 1.65 volts. In other words, the intensities and apparent dimensions of the contact holes in the second sub-region 304 appear to be independent of the applied voltage differences. This lack of variation (lack of dependence) may be calculated from the image data, and a determination may be made based on that calculation as to the resistance of the contact holes in the second sub-region 304. In this case, the lack of substantial variation with respect to applied voltage differences indicates a high contact resistance and hence incompletely etched contact holes.

Figure 4:
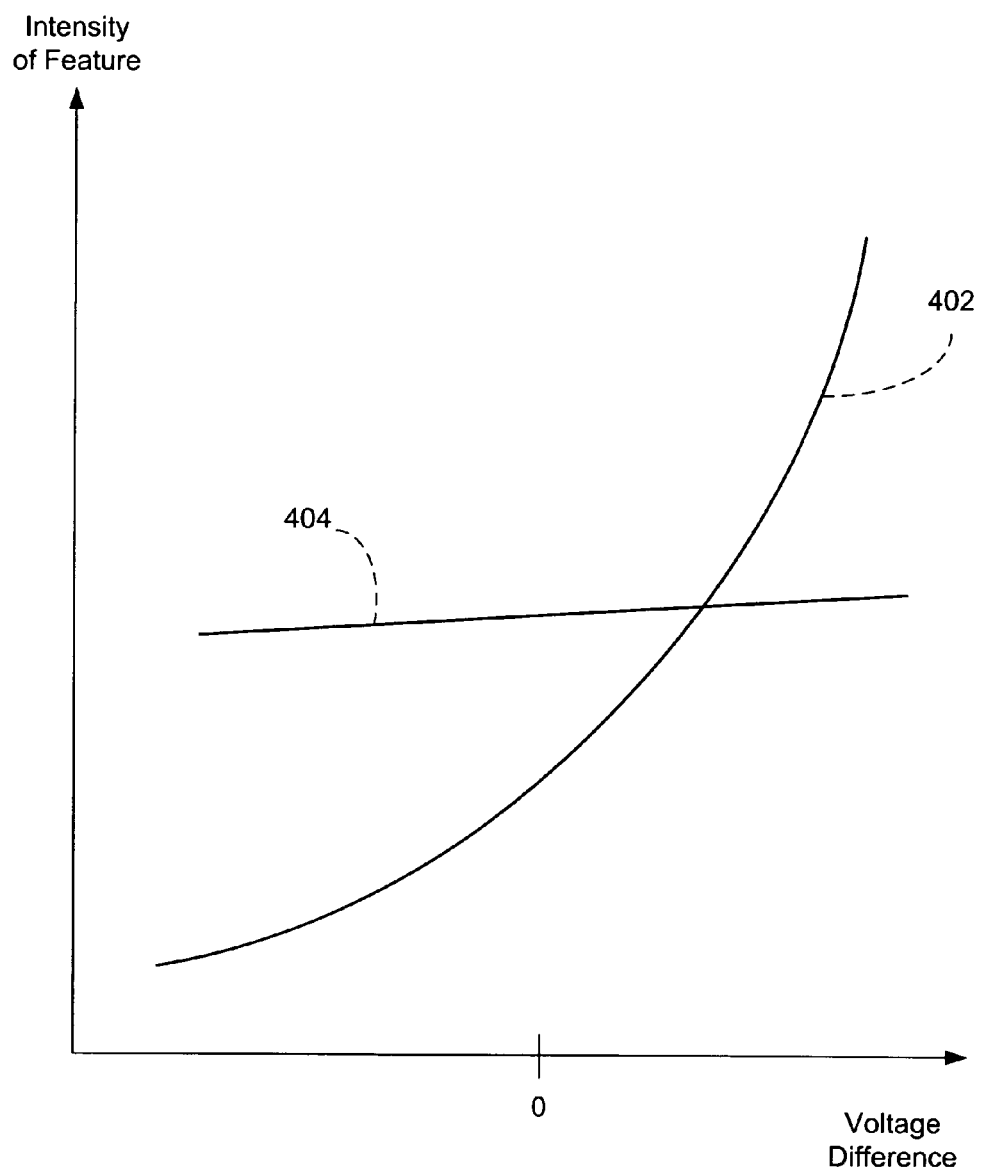
FIG. 4 is an illustrative diagram showing example intensity-voltage curves for hypothetical features with and without an electrical defect in accordance with an embodiment of the invention.

FIG. 4 is an illustrative diagram showing example intensity-voltage curves for hypothetical features with and without an electrical defect in accordance with an embodiment of the invention. As illustrated in FIG. 4, a first hypothetical intensity-voltage curve 402 shows a strong variation in intensity depending on the applied voltage difference between the substrate stage and the electron source. In contrast, a second hypothetical intensity-voltage curve 404 shows much less variation in intensity depending on the applied voltage difference.

For example, consider that the features are contact holes as discussed above in relation to FIG. 3. In that case, cleanly-etched contact holes with low resistance are expected to show substantial variation in mirror-mode intensity with respect to applied voltage difference. Hence, such cleanly-etched holes would expect to exhibit an intensity-voltage curve somewhat like the first hypothetical curve 402. In contrast, incompletely-etched contact holes with high resistance are expected to show much less variation in mirror-mode intensity with respect to the applied voltage difference. Hence, such incompletely-etched holes would expect to exhibit an intensity-voltage curve somewhat like the second hypothetical curve 404.

Figure 5A:
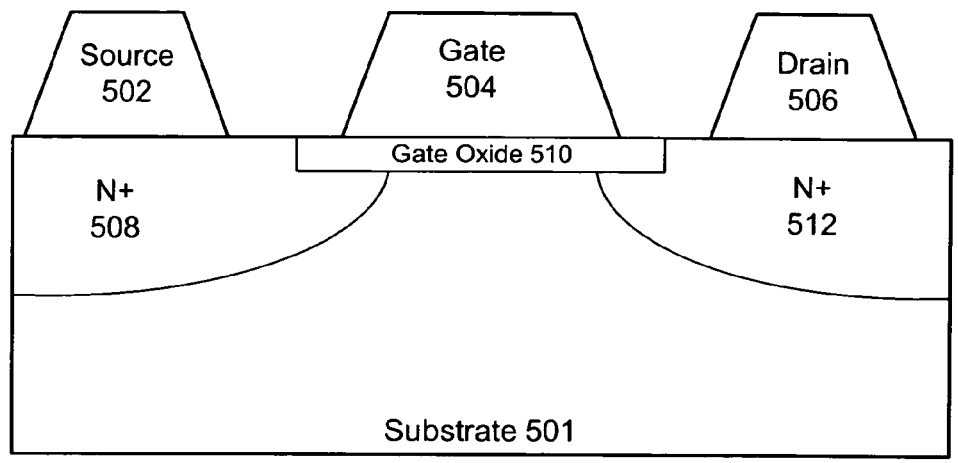
FIGS. 5A and 5B are cross-sectional diagrams showing an example transistor with a non-defective and a defective gate oxide, respectively.
Figure 5B:
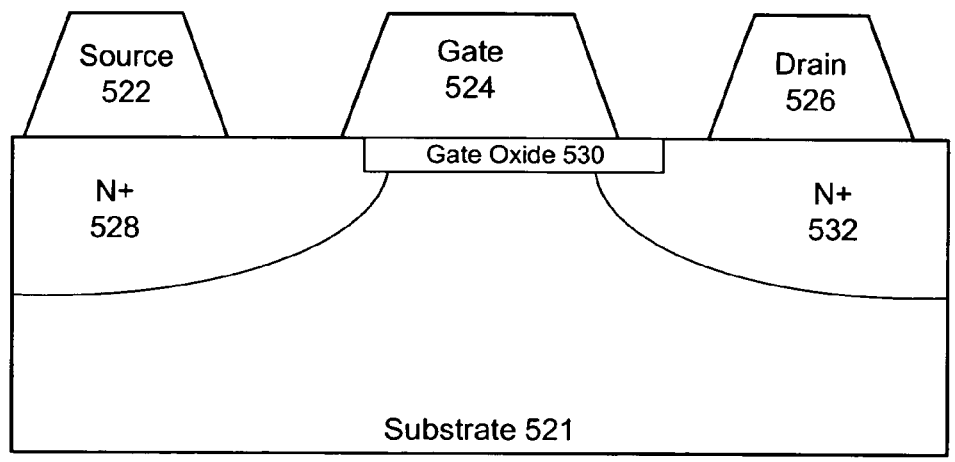

In another explanatory example, FIG. 5A is a simplified cross-sectional diagram of a transistor 500 with a non-defective gate oxide 510, and FIG. 5B is a simplified cross-sectional diagram of a transistor 520 with a defective gate oxide 530. These simple diagrams show a source 502 (or 522), gate 504 (or 524), and drain 506 (or 526) of an N-channel transistor 500 (or 520) fabricated on a substrate 501 (or 521). An N+ well 508 (or 528) is shown below the source, and an N+ well 512 (or 532) is shown below the drain.

The transistor 500 of FIG. 5A has a non-defective gate oxide 510 below its gate 504. In contrast, the transistor 520 of FIG. 5B has a defective gate oxide 530 below its gate 524. In this example, the defective gate oxide 530 provides an electrical path directly from the source's N+ well 528 to the gate 524. This is another example of an electrical process defect.

In this case, mirror-mode electron imaging of the non-defective gate 504 would be expected to show little variation in intensity and/or apparent size with respect to the applied voltage difference. In contrast, mirror-mode electron imaging of the defective gate 524 would be expected to show substantially higher variation in intensity and/or apparent size with respect to the applied voltage difference.

The contact holes discussed above in relation to FIGS. 3 and 4, and the gates discussed above in relation to FIGS. 5A and 5B, are examples of electrical process defects which are discernable and detectable by using the technique disclosed herein. Other electrical process defects are also discernable and detectable by using the technique disclosed herein. Detectable electrical process defects include open circuits, short circuits, contact resistance, under-etched contacts, junction leakage, gate oxide breakdown, transistor threshold, and others.

Figure 6:
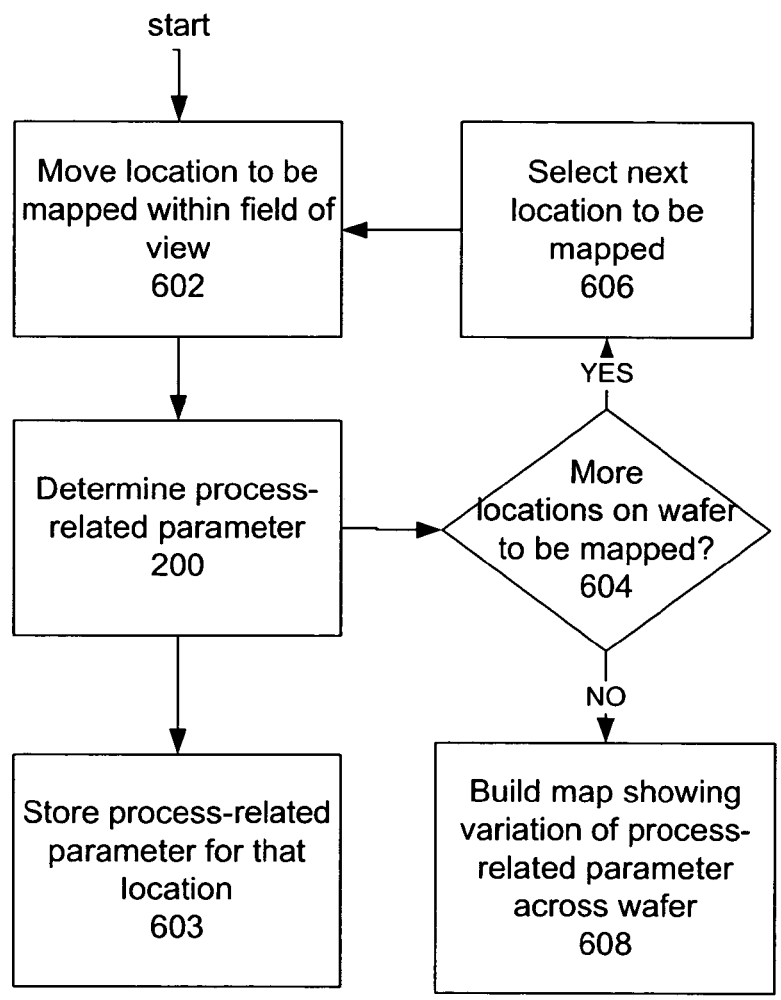
FIG. 6 is a flow chart depicting a method of mapping process variation across a semiconductor wafer in accordance with an embodiment of the invention.

FIG. 6 is a flow chart depicting a method 600 of mapping process variation across a semiconductor wafer (or other substrate) in accordance with an embodiment of the invention. As discussed below, this method 600 applies the method 200 of determining a process-related parameter of FIG. 2 multiple times at various locations on a wafer (or other substrate). With that information, a map may be built showing variation of the process-related parameter over the wafer (or other substrate).

As shown in FIG. 6, a location to be mapped may be moved 602 within the field of view of the apparatus. This may be accomplished, for example, by controlled movement of the stage holding the target substrate. Thereafter, the process 200 of FIG. 2 may be applied so as to determine a process-related parameter for that location. For example, a measure of contact resistance may be determined for contacts at that location. The process-related parameter for that location may then be stored 603 for later use and analysis.

A determination 604 is made as to whether there are more locations on the wafer to be mapped. Preferably, a set of locations is mapped which are distributed across the wafer (or other substrate) so as to provide a useful map of process variation. For example, each location may be at a different integrated circuit die on a semiconductor wafer.

If there are more locations on the wafer to be mapped, then the next location to be mapped is selected 606, and the process 600 may loop back to move 602 the selected location within the field of the view of the apparatus and determine 200 the process-related parameter at that location.

Once there are no more locations to be mapped, then the process 600 may move on to build 608 a map showing variation of the process-related parameter over the wafer (or other substrate). For example, the map may show the variation of contact resistance (or other measurable parameter) over the wafer (or other substrate). Such a map may be advantageously used to adjust the fabrication process so as to minimize the process variation over the substrate.

Advantageously, the above-disclosed technique may be used to detect electrical process defects with improved sensitivity over various prior techniques. Using the above-disclosed technique, voltage contrast sensitivity in the tens of milli-volts has been demonstrated for submicron feature sizes.

Figure 7:
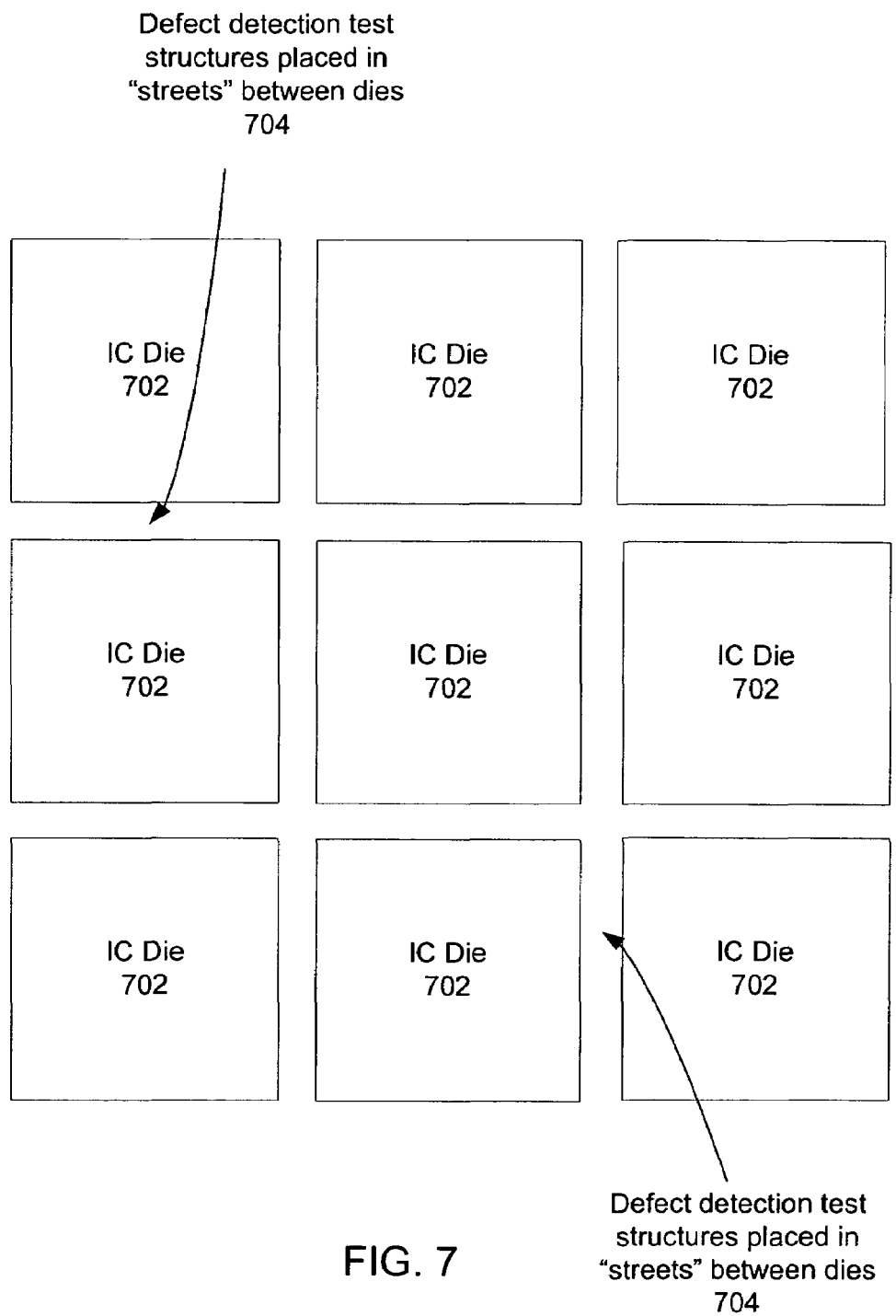
FIG. 7 is a schematic diagram depicting placement of special structures to enhance detection of process defects in accordance with an embodiment of the invention.

In accordance with another embodiment of the invention, special test structures may be fabricated on the wafer so as to enhance the detection of potential process defects. In one advantageous implementation, as illustrated in FIG. 7, these test structures 704 may be positioned in the regions (i.e. in the "streets") between integrated circuit dies 702 on a semiconductor wafer. The test structures may be configured to increase the sensitivity of the structures to process variations or defects. For example, the test structures may be configured with special doping, large-area transistors, or uLoop type structures to enhance process defect detection. The test structures 704 may be distributed across the wafer so as to be able to build maps showing variation of process-related parameters across the wafer, as discussed above in relation to FIG. 6.

The above-described diagrams are not necessarily to scale and are intended be illustrative and not limiting to a particular implementation.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of inspecting a substrate using electrons, the method comprising:
   obtaining multiple images of a region of the substrate using mirror-mode electron-beam imaging at a range of voltage differences between an electron source and a substrate, each said image corresponding to one said voltage difference;
   storing image data corresponding to the multiple voltage differences; and
   calculating a measure of variation of an imaged aspect of a feature in the region with respect to the voltage difference between the electron source and the substrate,
   wherein the method provides sub-volt voltage contrast between said images without needing to use an energy-filter with sub-volt resolution.

2. The method of claim 1, wherein the imaged aspect of the feature comprises an intensity of the feature.

3. The method of claim 1, wherein the imaged aspect of the feature comprises an apparent size of the feature.

4. The method of claim 1, further comprising determining a process-related parameter based at least in part on the calculated measure of variation of the imaged aspect of the feature with respect to the voltage difference.

5. The method of claim 4, further comprising obtaining and storing image data from multiple locations on the substrate.

6. The method of claim 5, further comprising building a map showing variation of the process-related parameter over the substrate.

7. The method of claim 1, wherein the voltage difference is varied by changing a voltage applied to a stage holding the substrate.

8. The method of claim 1, wherein the voltage difference is varied by changing a voltage at the electron source.

9. The method of claim 1, wherein the substrate comprises a semiconductor wafer, and wherein the method is applied in-line during the fabrication of integrated circuits on the semiconductor wafer.

10. The method of claim 1, further comprising providing a higher-energy electron beam for substrate charge control.

11. The method of claim 1, further comprising illuminating the region with an ultraviolet light beam for substrate charge control.

12. The method of claim 1, wherein the region of the substrate being imaged includes test structures positioned in between integrated circuit dies on a semiconductor wafer.

13. An apparatus comprising:
an electron beam instrument configured for obtaining multiple images of a region of the substrate using mirror-mode electron beam imaging at a range of voltage differences between an electron source and a substrate, each said image corresponding to one said voltage difference;
a data processing system configured to store image data corresponding to the multiple voltage differences; and
processor-executable code configured to calculating a measure of variation of an imaged aspect of a feature in the region with respect to the voltage difference between the electron source and the substrate,
wherein the apparatus provides sub-volt voltage contrast between said images without needing to use an energy filter with sub-volt resolution.

14. The apparatus of claim 13, further comprising processor-executable code configured to determine a process-related parameter based at least in part on the calculated measure of variation of the imaged aspect of the feature with respect to the voltage difference.

15. The apparatus of claim 14, further comprising processor-executable code configured to obtain and store image data from multiple locations on the substrate.

16. The apparatus of claim 15, further comprising processor-executable code configured to build a map showing variation of the process-related parameter over the substrate.

17. The apparatus of claim 13, wherein the electron beam instrument utilizes a second electron source to provide an electron beam for substrate charge control.

18. The apparatus of claim 13, further comprising a UV light source configured to illuminate the region for surface charge control.

19. An apparatus for inspecting a substrate using a projection electron beam system, the apparatus comprising:
an illumination subsystem configured to generate an incident electron beam;
an objective subsystem configured to receive the incident electron beam, to focus the incident electron beam onto a region of the substrate, and to retrieve a scattered beam from the substrate;
a projection subsystem configured to receive the scattered beam and to project the scattered beam onto a detector so as to detect electron images of the region; and
a beam separator coupled to and interconnecting the illumination subsystem, the objective subsystem, and the projection subsystem, wherein the beam separator is configured to receive the incident beam from the illumination subsystem, bend the incident electron beam towards the objective subsystem, receive the scattered beam from the objective subsystem, and bend the scattered beam towards the projection subsystem, and
a control system configured to vary a potential difference between a source of the incident electron beam and the substrate,
wherein the electron images are obtained of using mirror-mode electron-beam imaging at a range potential differences between the source and the substrate, each said image corresponding to one said potential difference, and
further wherein the apparatus provides sub-volt voltage contrast between said images without needing to use an energy-filter with sub-volt resolution.

20. The apparatus of claim 19, further comprising a data processing system configured to calculate a measure of variation of an imaged aspect of a feature with respect to the potential difference.

21. The apparatus of claim 20, wherein the imaged aspect of the feature comprises an intensity of the feature.

22. The apparatus of claim 20, wherein the imaged aspect of the feature comprises an apparent size of the feature.

23. The apparatus of claim 20, wherein the data processing system is further configured to determine a process-related parameter based at least in part on the calculated measure of variation of the imaged aspect of the feature with respect to the potential difference.

24. The apparatus of claim 23, wherein the control system is further configured to obtain image data from multiple locations on the substrate.

25. The apparatus of claim 24, wherein the data processing system is further configured to build a map showing variation of the process-related parameter over the substrate.

26. The apparatus of claim 19, wherein the control system varies the potential difference by changing a voltage applied to a stage holding the substrate.

27. The apparatus of claim 19, wherein the control system varies the potential difference by changing a voltage at the source of the incident electron beam.

28. The apparatus of claim 19, wherein the apparatus generates a second incident electron beam for substrate charge control.

29. The apparatus of claim 19, further comprising a UV light source configured to illuminate at least a portion of the substrate for surface charge control.

30. A method of inspecting a substrate using electrons, the method comprising:
obtaining multiple images of a region of the substrate using mirror-mode electron-beam imaging at a range of voltage differences between an electron source and a substrate, each said image corresponding to one said voltage difference;
storing mirror-mode image data corresponding to the multiple voltage differences;
scattered electron imaging of the region;

storing the scattered electron image data; and
comparing gray levels of a feature in the region in the mirror-mode image data to the scattered electron image data of the feature,
wherein the method provides sub-volt voltage contrast between said images without needing to use an energy-filter with sub-volt resolution.

31. The method of claim 30, wherein the scattered electron imaging comprises secondary electron imaging.

32. The method of claim 30, wherein the scattered electron imaging comprises backscattered electron imaging.

* * * * *